United States Patent [19]

McGalliard

[11] 4,144,555
[45] Mar. 13, 1979

[54] SINGLE MOUNT ELECTRICAL CONTROL DEVICE ASSEMBLY

[76] Inventor: James D. McGalliard, 11171 Fenwick Pl., Santa Ana, Calif. 92705

[21] Appl. No.: 876,080

[22] Filed: Feb. 8, 1978

[51] Int. Cl.² .............................................. H05K 7/20
[52] U.S. Cl. .................................... 361/386; 361/346; 361/401
[58] Field of Search .................. 174/16 HS; 361/346, 361/381, 401, 386–389; 357/81; 338/317, 333

[56] References Cited

U.S. PATENT DOCUMENTS

| | | | |
|---|---|---|---|
| 2,881,364 | 4/1959 | Demer | 361/386 |
| 3,480,836 | 11/1964 | Aronstein | 361/386 |
| 3,739,232 | 6/1973 | Grossman | 361/401 |
| 3,801,874 | 4/1974 | Stefani | 357/81 |

*Primary Examiner*—Gerald P. Tolin
*Attorney, Agent, or Firm*—Knobbe, Martens, Olson, Hubbard & Bear

[57] ABSTRACT

A combination of a potentiometer and an integrated circuit module are mounted on a printed circuit board which interconnects these members and provides for external connections. Mechanical mounting of the printed circuit board, the potentiometer, and the integrated circuit module is provided by a single mounting bushing of the potentiometer. The mounting arrangement also permits a heat sink tab on the integrated circuit to be clamped by this mounting bushing directly against the front panel of a user's equipment. Thus, the single mechanical mounting connection for the combination at the potentiometer bushing not only mechanically mounts all of the elements but additionally provides a heat sink connection for the circuit. At the same time, the use of the printed circuit board in this combination permits automated assembly and soldering which substantially reduces the cost of the circuit.

9 Claims, 3 Drawing Figures

SINGLE MOUNT ELECTRICAL CONTROL DEVICE ASSEMBLY

BACKGROUND OF THE INVENTION

The use of integrated circuit modules on printed circuit boards is, of course, well known, as is the combination of integrated circuits and a potentiometer for use in light dimming configurations, motor control configurations, etc. Many of these applications provide SCR's, diacs, or triacs used for controlling alternating current power in response to the setting of the potentiometer.

Most such circuits, if used to control high current loads, generate substantial amounts of heat in the integrated circuit module which must be drawn from the module using any one of a variety of heat sink products. The prior art has also provided for the heat sinking of such integrated circuit elements directly into the front panel of an instrument onto which the potentiometer is mounted.

Thus, the prior art has provided potentiometers combined with integrated circuits wherein the potentiometer mounting bushing has been passed through a hole in a heat sink tab from an integrated circuit to directly mount the heat sink tab, the integrated circuit, and the potentiometer to the front panel of a user's instrument, all through the application of a single potentiometer bushing nut.

Although this prior art configuration has proved satisfactory in most circumstances, the combination has always been hand wired because of the requirement that the heat sink tab of the integrated circuit must abut, in face-to-face relationship, against the user's front panel. This requires a side-by-side configuration of the integrated circuit body and the potentiometer body which would, under normal circumstances, prohibit the use of printed circuit boards which would facilitate automatic part insertion and machine soldering of the entire assembly.

As a consequence of the prior art requirements for hand wiring, prior art combination devices, including a potentiometer wired to control an integrated circuit, particularly for controlling AC current levels, have been relatively high in cost, much of the cost incurred in the hand wiring operation.

The prior art, in the interest of machine insertion and wiring techniques, has, in many instances, utilized separate heat sink elements rather than utilizing the front panel of the user's equipment for heat sinking. By using an alternate heat sink, it is possible to place the heat sink tab of the integrated circuit at a location other than that which will be abuted against the user's front panel, and to thus combine the potentiometer and integrated circuit on a printed circuit board in a conveniently wired fashion. This arrangement, however, requires that a separate heat sink be provided, which heat sink adds to the complexities of the mechanical assembly, since it must be separately mounted on the integrated circuit heat sink tab, and adds to the cost of material. Thus, even this expedient, while reducing the labor costs to some extent, necessarily increases the costs of the combination unit.

SUMMARY OF THE INVENTION

The present invention alleviates these and other difficulties associated with the prior art by providing a mounting for a printed circuit board, an integrated circuit module, and an associated potentiometer, all on a single mounting bushing of the potentiometer, while at the same time providing a direct heat sinking of the integrated circuit into a front panel of the user's instrument.

This advantageous combination of features is made possible by providing a large opening in the printed circuit board so that the integrated circuit module can be located in the same plane as the printed circuit board. This location of the integrated circuit permits wiring of the integrated circuit on one side of the printed circit board, while the heat sink tab of the integrated circuit extends on the other side of the printed circuit board. Thus, the wiring can be done on a side of the printed circuit board opposite the ultimate user's front panel, while the heat sink tab extends on the side of the printed circuit board adjacent the user's front panel for direct heat sinking.

With the integrated circuit thus embedded, in effect, in the plane of the printed circuit board, a wave soldering process can be used to solder the leads from the potentiometer and the integrated circuit module to the printed circuit board, to interconnect these units and to provide for external connections to the circuit assembly.

The provision of a single mounting bolt to mount all three elements, that is, the printed circuit board, potentiometer, and integrated circuit, reduces the cost of mechanical assembly of this device, while the use of the printed circuit board reduces the cost of the electronic assembly.

Thus, the combination of the present invention provides reduced cost in both mechanical and electronic assembly and, at the same time, avoids any requirement for additional heat sinks which could increase the cost of the ultimate circuit.

These and other advantages of the present invention are best understood through a reference to the drawings, in which.

DETAILED DESCRIPTION OF THE PREFERRED EMBODIMENT

Figure 1:
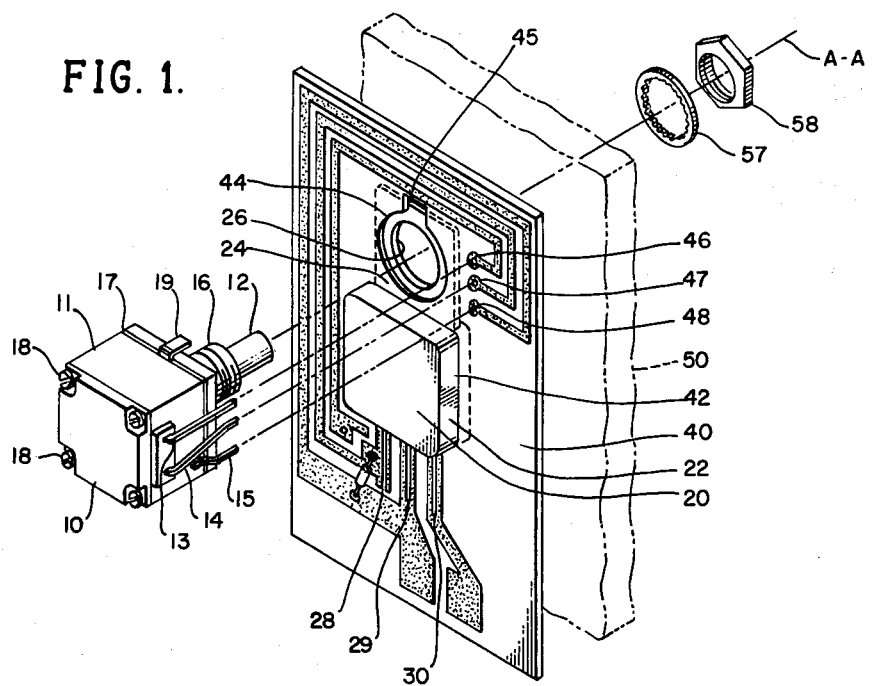
FIG. 1 is a perspective exploded view showing the potentiometer, integrated circuit, and interconnecting circuit board of the present invention associated with a front panel of a user's device, which is shown in phantom lines.

The combination of the present invention includes a potentiometer 10, integrated circuit module 20, and an interconnecting circuit board 40 associated with a front panel 50 of a user's device.

The potentiometer 10 is well known in the art and is preferably composed of a phenolic plastic housing 11 which encases a variable resistor core (not shown) and a rotatably mounted spindle shaft 12. Connected in the conventional manner to the internal components of the potentiometer 10 and extending through the housing 11 adjacent one side thereof, are three leads 13, 14, and 15 which provide the electrical connections to the potentiometer 10. A threaded mounting bushing 16, preferably fabricated of metal, having an aperture therethrough to accommodate the diameter of the spindle shaft 12, is provided adjacent one end thereof and is securely mounted to the housing 11 by four machine screws 18. Disposed between the housing 11 and the threaded bushing 16, is a thin metal shim 17 having an axial extending tab 19 which registers the potentiometer 10 with the interconnecting circuit board 40 during assembly.

The integrated circuit module 20 is fabricated in a conventional manner and comprises an integrated circuit (not shown), a casing 22, and a heat sink tab 24. This integrated circuit module 20 produces excess heat during control of high current loads and will fail during such operation unless the heat sink tab 24 is abutted against the user's front panel 50. The heat sink tab 24 is preferably formed of a thin metal plate having an aperture 26 therethrough, the diameter of which is slightly larger than the thread diameter of the mounting bushing 16. The heat sink tab 24 is typically bonded to the integrated circuit (not shown) of the module 20 by an epoxy resin which acts as an electrical insulator and a high thermal conductor, thereby allowing heat generated during operation to be conducted away through the tab 24 without electrically shorting the integrated circuit.

The interconnecting circuit board 40, preferably made of fiberglass, is printed on one side thereof and can be fabricated in one of the well known printed circuit board processes. Extending through the central region of the board 40 is a square slot 42 which is slightly larger in size than the casing 22 of the integrated circuit module 20. Positioned adjacent the square slot 42 is a keyhole-like aperture 44, the diameter of which is slightly larger than the annular aperture 26 of the heat sink tab 24. Three small holes 46, 47, and 48 extend through the circuit board 40 and receive leads 13, 14, and 15, respectively, during assembly.

Figure 3:
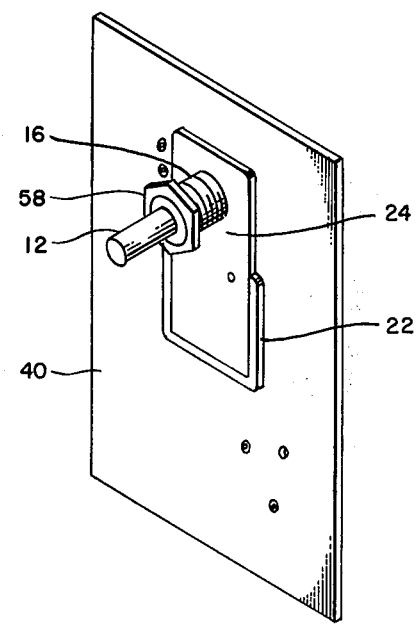
FIG. 3 is a perspective view of the underside of the combined apparatus of the present invention showing the extension of the heat sink tab on the underside of the printed circuit board.

The assembly of the potentiometer 10, integrated circuit module 20, and the interconnecting circuit board 40 can now be described. Referring to FIG. 1, the integrated circuit module 20 is inserted through the square slot 42 of the circuit board 40 and is positioned in a manner which provides the heat sink tab 24 and the casing 22 to be located substantially on opposite sides of the circuit board 40. This positioning, wherein the integrated circuit module 20 is located within the same plane as the interconnecting circuit board 40, facilitates the subsequent wiring of the integrated circuit module 20 on one side of the board (as shown in FIG. 1) while the heat sink tab 24 extends exclusively on the other side of the board (as shown in FIG. 3).

Referring to FIG. 1, it can be seen that, when positioned in this manner, the aperture 26 extending through the heat sink tab 24, is aligned with a keyhole-like aperture 44 of the interconnecting circuit board 40 about axis A—A.

The potentiometer 10 may now be assembled with the interconnecting circuit board 40 wherein the spindle 12 and threaded bushing 16 of the potentiometer 10 is inserted along axis A—A through the aligned apertures 44 and 26 of the interconnecting circuit board 40 and the heat sink tab 24, respectively.

During insertion, the axial extending tab 19 of the potentiometer 10 cooperates with the notch 45 of the keyhole-like aperture 44 to register the potentiometer 10 with the interconnecting circuit board 40 thereby allowing the leads 13, 14, 15 of the potentiometer 10 to enter into the small holes 46, 47, 48, respectively, formed in the interconnecting circuit board 40. Insertion of the potentiometer 10 is complete when the square base of the threaded bushing 16 abuts the interconnecting circuit board 40.

In this orientation, i.e., with the potentiometer 10 and the integrated circuit module 20 disposed and registered upon interconnecting circuit board 40, a wave soldering or other conventional machine soldering process may be used to solder the leads 13, 14, and 15 of the potentiometer 10 and the leads 28, 29, and 30 of the integrated circuit module 20 to the printed circuit board 40, thereby providing interconnection of the assembly as well as external connections to the circuit.

Figure 2:
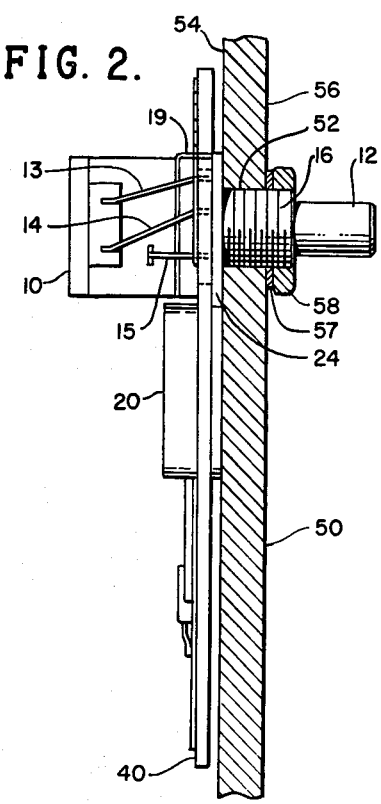
FIG. 2 is a sectional view taken through the front panel of a user's instrument and showing the assembly of the present invention in elevation.

Referring to FIG. 2, the single mounting bolt feature of the present invention can be described. A hole 52, the diameter of which is slightly larger than the diameter of the threaded bushing 16, is drilled through the user's front instrument panel 50. Subsequently, the spindle 12 and threaded bushing 16, extending outward from the soldered assembly, are inserted through the hole 52 from the back surface 54 of the user's panel 50. The threaded bushing 16 must be sufficient in length to extend beyond the front surface 56 of the panel 50 to receive a lock washer 57 and threaded fastener 58. Upon tightening of the fastener 58, the heat sink tab 24, which protrudes from the interconnecting circuit board 40 (as shown in FIG. 3), is drawn toward and abutted against the back surface 54 of the panel 50 and the entire assembly of the potentiometer 10, integrated circuit module 20, and interconnecting circuit board 40 is securely mounted to the panel 50.

Due to this abutment of the heat sink tab 24 with the back surface 54 of the panel 50, the entire panel 50 acts as a heat sink to conduct the heat generated during operation away from the integrated circuit module 20.

Thus, it can be easily understood that the present invention avoids the costly requirements of additional heat sinks and provides an economical machine wired and single-bolt mounted electrical assembly.

It is important toznote that the heat sink tab 24 extends on the opposite side of the circuit board 40 from the conductors of the printed circuit board 40, reducing the chance of short circuits between the circuit board conductors and the panel 50.

This placement of the tab 24 on one side of the board, with the integrated circuit in the plane of the board, results in a compact, easily used circuit which may be machine assembled to reduce cost.

What is claimed is:

1. An electrical control device assembly mountable against an instrument panel comprising:
    a circuit board;
    a variable resistor mounted to said circuit board;
    an integrated circuit module mounted to said circuit board so as to be disposed within the same plane as said circuit board;
    heat sink means connected to said integrated circuit module and extending adjacent one side of said circuit board; and
    mounting means fastening together said circuit board, variable resistor, and integrated circuit module, and urging said heat sink means directly against an instrument panel.

2. The electrical control device assembly of claim 1 wherein said heat sink means comprises a heat sink tab which is integrally formed with said integrated circuit module.

3. The electrical control device assembly of claim 1 wherein said integrated circuit module is located within an aperture formed in said circuit board.

4. The electrical control device assembly of claim 1 wherein said mounting means comprises a threaded mounting bushing.

5. The electrical control device assembly of claim 4 wherein said single mounting bushing comprises a threaded bushing mounted to said variable resistor and extending through said heat sink means.

6. An electrical control device assembly mountable directly against a heat conducting instrument panel comprising:
- a potentiometer;
- an integrated circuit module having electrical terminals extending therefrom and a heat sink tab formed on its bottom surface;
- an interconnecting circuit board having an aperture therethrough;
- said potentiometer mounted on one side of said interconnecting circuit board and said integrated circuit module disposed within said aperture such that said electrical terminals extend on said one side of said board while said heat sink tab extends on the other side of said board; and
- mounting means securely fastening together said potentiometer, integrated circuit module, and interconnecting circuit board and urging said heat sink means directly against an instrument panel.

7. The electrical control device assembly of claim 6 wherein said heat sink means comprises a heat sink tab having an aperture adjacent one end thereof.

8. The electrical control device assembly of claim 6 wherein said mounting means comprises a threaded bushing mounted to said potentiometer and extending through said heat sink means.

9. An electrical control device assembly mountable directly against an instrument panel comprising:
- a potentiometer;
- an integrated circuit module;
- an interconnecting circuit board having an aperture therethrough;
- said potentiometer mounted on one side of said interconnecting circuit board, said integrated circuit module mounted within said aperture and in the same plane of said interconnecting circuit board;
- heat sink means connected to said integrated circuit module extending on the other side of said interconnecting circuit board; and
- mounting means extending from said potentiometer and urging said heat sink means directly against an instrument panel.

* * * * *